(12) United States Patent
Nawa et al.

(10) Patent No.: US 9,859,190 B2
(45) Date of Patent: Jan. 2, 2018

(54) RESIN STRUCTURE, AND ELECTRONIC COMPONENT AND ELECTRONIC DEVICE USING THE STRUCTURE

(71) Applicant: Panasonic Intellectual Property Management Co., Ltd., Osaka (JP)

(72) Inventors: Honami Nawa, Osaka (JP); Hirohisa Hino, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/409,519

(22) Filed: Jan. 18, 2017

(65) Prior Publication Data

US 2017/0243804 A1    Aug. 24, 2017

(30) Foreign Application Priority Data

Feb. 24, 2016  (JP) ................................. 2016-033504

(51) Int. Cl.
*H01L 23/373* (2006.01)
*B05D 7/00* (2006.01)
*H01L 23/42* (2006.01)

(52) U.S. Cl.
CPC ........ *H01L 23/3737* (2013.01); *B05D 7/5483* (2013.01); *H01L 23/42* (2013.01)

(58) Field of Classification Search
CPC .................................................. H01L 23/3737
See application file for complete search history.

(56) References Cited

U.S. PATENT DOCUMENTS

| | | | |
|---|---|---|---|
| 2007/0097651 A1 | 5/2007 | Canale et al. | |
| 2007/0164349 A1* | 7/2007 | Nakasato | H01L 21/6835 257/318 |
| 2008/0241488 A1 | 10/2008 | Ohta et al. | |

(Continued)

FOREIGN PATENT DOCUMENTS

| | | |
|---|---|---|
| JP | 2008-251747 | 10/2008 |
| JP | 2012-144687 | 8/2012 |

(Continued)

*Primary Examiner* — Eugene Lee
(74) *Attorney, Agent, or Firm* — Panasonic IP Management; Kerry S. Culpepper

(57) ABSTRACT

Provided herein is a resin structure having high heat dissipation, and desirable adhesion at the interface with a heat generating device. The resin structure is provided on a substrate to dissipates heat of the substrate to outside, and includes: a water-based coating material layer provided on the substrate and including a water-based coating material, and fillers having an average particle size of 30 μm to 150 μm; and a resin layer provided on the water-based coating material layer and containing a thermosetting resin. The fillers have a far-infrared emissivity of 0.8 or more, and an average aspect ratio of 1 to 12 as measured as a ratio of lengths along the long axis and the short axis through the center of gravity of the fillers. At least 80% of the total number of fillers has a length that is at least 1.7 times longer than the total thickness of the water-based coating material of the water-based coating material layer and the thermosetting resin of the resin layer, as measured along the long axis through the center of gravity of the fillers.

8 Claims, 5 Drawing Sheets

(56) References Cited

U.S. PATENT DOCUMENTS

| | | | |
|---|---|---|---|
| 2011/0284914 A1* | 11/2011 | Suzuki | H05K 1/0204 |
| | | | 257/99 |
| 2012/0218715 A1 | 8/2012 | Hirose et al. | |
| 2013/0012621 A1* | 1/2013 | Yamamoto | C08K 3/10 |
| | | | 523/445 |
| 2013/0189514 A1 | 7/2013 | Nishiyama et al. | |
| 2014/0140008 A1* | 5/2014 | Yamaguchi | H01L 23/373 |
| | | | 361/705 |
| 2014/0226290 A1* | 8/2014 | Hayashi | H05K 3/4655 |
| | | | 361/748 |
| 2015/0048402 A1* | 2/2015 | Urano | H01L 33/60 |
| | | | 257/98 |
| 2015/0180099 A1 | 6/2015 | Hino et al. | |
| 2015/0257251 A1* | 9/2015 | Kagawa | C09K 5/14 |
| | | | 428/220 |

FOREIGN PATENT DOCUMENTS

| | | |
|---|---|---|
| JP | 2013-048257 | 3/2013 |
| JP | 2013-229534 | 11/2013 |
| JP | 2014-220280 | 11/2014 |
| WO | 2014/175344 | 10/2014 |

* cited by examiner

*FIG. 2A*     *FIG. 2B*     *FIG. 2C*
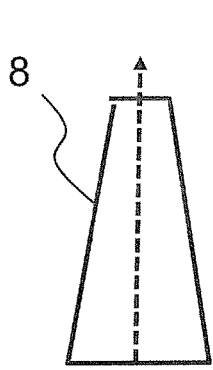
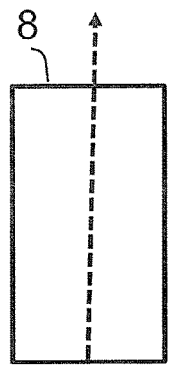
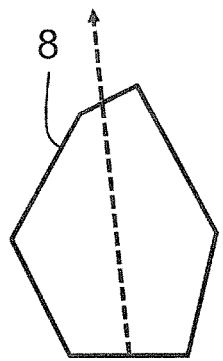
*FIG. 3*
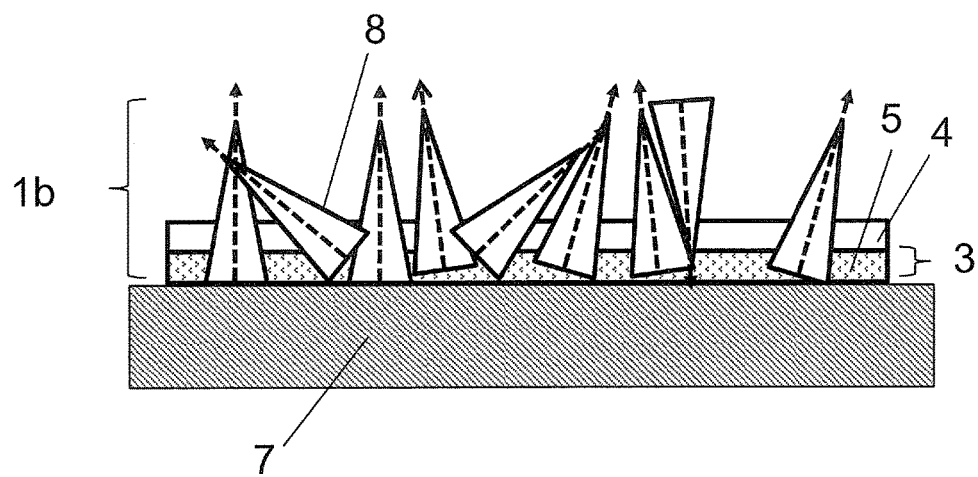

RESIN STRUCTURE, AND ELECTRONIC COMPONENT AND ELECTRONIC DEVICE USING THE STRUCTURE

TECHNICAL FIELD

The technical field relates to a resin structure for dissipating the heat of a heat generator to outside by thermal radiation, and to an electronic component and an electronic device using the structure.

BACKGROUND

The heat density of power devices and semiconductor packages has increased along with miniaturization and increased density of these devices. Electronic components installed in these devices thus require a technique that efficiently dissipates the generated heat of individual components to keep the components below the designed operating temperature.

Fins that take advantage of convection, and heat conduction sheets that take advantage of heat conduction are commonly used as means to dissipate heat in products. However, it has become difficult to dissipate heat and keep the temperature below the designed operating temperature of a heat generating device solely by the traditional approach using heat dissipating means such as above.

Heat-dissipating coating materials that take advantage of thermal radiation have attracted interest as a means to dissipate heat without requiring an additional space. Particularly, a heat-dissipating coating material using a water-based coating material has desirable ease of handling because it uses water as solvent.

FIG. 8 is a cross sectional view representing a configuration of an electronic component fabricated by using a related art method. The electronic component is configured from a heat-dissipating member 57, and a metal substrate 51. The heat-dissipating member 57 is coated over the surface of the metal substrate 51, and serves to dissipate the heat of the metal substrate 51. The heat-dissipating member 57 is configured from a water-based coating material 58 and fillers 59. The fillers 59 have high far-infrared emissivity, and can form a desirable heat-dissipating film by being mixed with the water-based coating material 58.

SUMMARY

In the configuration of the heat-dissipating member 57 shown in FIG. 8, the fillers 59 present inside the heat-dissipating member 57 inhibit the thermal radiation of heat from the surfaces of the fillers 59. Accordingly, the efficiency of thermal radiation from the heat-dissipating member 57 does not improve even when the fillers 59 are packed in high density.

The water-based coating material 58 uses resin for ease of handling. However, this material cannot provide sufficient adhesion at the interface between the heat-dissipating member 57 and the metal substrate 51. With poor adhesion, the thermal resistance between the heat-dissipating member 57 and the metal substrate 51 increases, and the heat dissipation suffers. The configuration of WO2014/175344 provides the desired heat dissipating effect only under limited conditions, including when the surface temperature of the heat generating device is 200° C. or more, or when the heat generating device has a large area of heat generation. In all probability, this is not sufficient in terms of heat dissipation.

The present disclosure is intended to provide a solution to the problems of related art, as well as other concerns, and it is an object of the present disclosure to provide a resin structure having high heat dissipation, and desirable adhesion at the interface with a heat generating device.

A resin structure according to an aspect of the present disclosure is a resin structure provided on a substrate and for dissipating heat of the substrate to outside, and includes:

a water-based coating material layer provided on the substrate and including a water-based coating material, and fillers having an average particle size of 30 μm to 150 μm; and a resin layer provided on the water-based coating material layer and containing a thermosetting resin, the fillers having a far-infrared emissivity of 0.8 or more, and an average aspect ratio of 1 to 12 as measured as a ratio of lengths along the long axis and the short axis through the center of gravity of the fillers, at least 80% of the total number of fillers having a length that is at least 1.7 times longer than the total thickness of the water-based coating material of the water-based coating material layer and the thermosetting resin of the resin layer, as measured along the long axis through the center of gravity of the fillers.

In the resin structure of the aspect of the present disclosure, at least 80% of the total number of fillers have a length that is at least 1.7 times longer than the total thickness of the water-based coating material of the water-based coating material layer and the thermosetting resin of the resin layer, as measured along the long axis through the center of gravity of the fillers. Specifically, at least 80% of all fillers project out of the water-based coating material layer and the resin layer. This provides high heat dissipation. Further, the resin layer provided on the water-based coating material layer can support the projecting fillers, and sufficient adhesion can be provided at the interface between the resin structure and the heat generating device.

By providing the resin structure for a heat generating device, the generated heat from the heat generating device can efficiently radiate into air. This makes it possible to reduce the heat energy of the heat generating device, and inhibit temperature increase in the heat generating device.

With the foregoing configuration of the resin structure, temperature increase can be effectively inhibited without having the need to install fans or heatsinks in an electronic component.

BRIEF DESCRIPTION OF THE DRAWINGS

FIGS. 2A to 2C are diagrams illustrating different shapes of fillers.

FIG. 3 is a cross sectional view representing a configuration in a cross section of a resin structure in which the fillers are not aligned along their long axis direction.

DESCRIPTION OF EMBODIMENTS

Figure 1A:
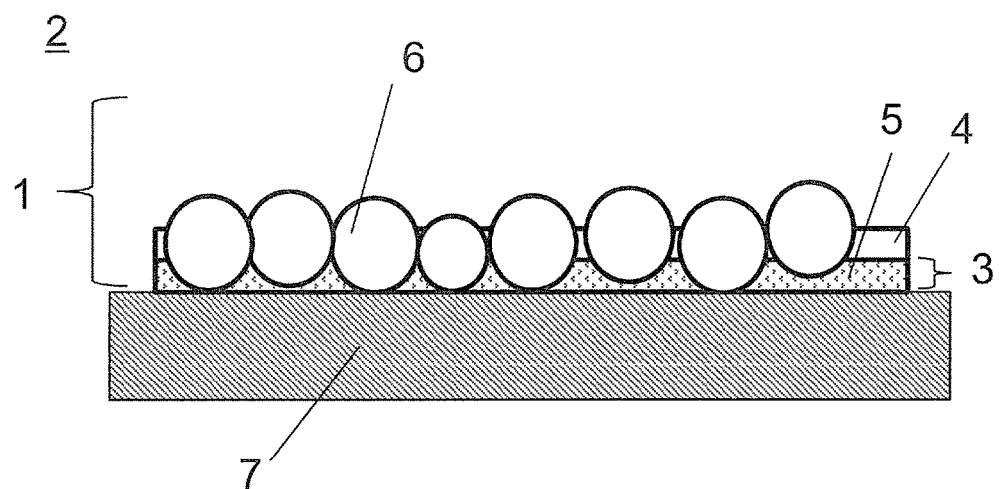
FIG. 1A is a cross sectional view showing a configuration in a cross section of a resin structure and an electronic component according to First Embodiment.

A resin structure according to a first aspect is provided on a substrate and dissipates heat of the substrate to outside, and includes:

a water-based coating material layer provided on the substrate and including a water-based coating material, and fillers having an average particle size of 30 µm to 150 µm; and a resin layer provided on the water-based coating material layer and containing a thermosetting resin, the fillers having a far-infrared emissivity of 0.8 or more, and an average aspect ratio of 1 to 12 as measured as a ratio of lengths along the long axis and the short axis through the center of gravity of the fillers, at least 80% of the total number of fillers having a length that is at least 1.7 times longer than a total thickness of the water-based coating material of the water-based coating material layer and the thermosetting resin of the resin layer, as measured along the long axis through the center of gravity of the fillers.

In a second aspect of the disclosure, the resin structure according to the first aspect may be such that the fillers are spherical, conical or pyramidal, or polyhedral in shape.

In a third aspect of the disclosure, the resin structure according to the first or second aspect may be such that the direction along the long axis is oriented in a direction perpendicular to the substrate in at least 60% of the total number of fillers.

In a fourth aspect of the disclosure, the resin structure according to any one of the first to third aspects may be such that the fillers are disposed so that adjacent two fillers are separated from each other by a distance that is not more than the average particle size of the fillers.

In a fifth aspect of the disclosure, the resin structure according to any one of the first to fourth aspects may be such that the fillers are contained in an amount of 60 volume % to 85 volume % of a composition of the water-based coating material layer.

In a sixth aspect of the disclosure, the resin structure according to any one of the first to fifth aspect may be such that the total thickness of the water-based coating material layer and the resin layer is 50 µm or less.

An electronic component according to a seventh aspect of the disclosure includes the resin structure of any one of the first to sixth aspects, wherein the substrate is an outer surface of the electronic component, and has the resin structure on an outer surface of the electronic component.

An electronic device according to an eighth aspect of the disclosure includes the electronic component of the seventh aspect.

Embodiments of the resin structure and the electronic component are described below in detail with reference to the accompanying drawings. In the drawings, the same reference numerals are used to denote essentially the same members.

First Embodiment

Resin Structure

FIG. 1A is a cross sectional view showing a configuration in a cross section of a resin structure 1 and an electronic component 2 according to First Embodiment. The resin structure 1 includes a water-based coating material layer 3 provided on a heat generating device 7, and a resin layer 4 provided on the water-based coating material layer 3. The water-based coating material layer 3 includes a water-based coating material 5, and spherical fillers 6. The spherical fillers 6 are at least partially present in the water-based coating material layer 3, and at least 80% of all fillers 6 have a length that is at least 1.7 times longer than the total thickness of the water-based coating material 5 of the water-based coating material layer 3 and the thermosetting resin of the resin layer 4, as measured along the long axis through the center of gravity of the fillers 6. The fillers 6 have a far-infrared emissivity of 0.8 or more, and an average aspect ratio of 1 to 12 as measured as a ratio of lengths along the long axis and the short axis through the center of gravity of the fillers 6. In other words, in the resin structure 1, the fillers 6 project out of the water-based coating material layer 3 and the resin layer 4.

Because the fillers 6 are projecting out of the water-based coating material layer 3 and the resin layer 4, the resin structure 1 can have high heat dissipation. The fillers 6 projecting out of the water-based coating material layer 3 and the resin layer 4 can be supported by the resin layer 4 provided on the water-based coating material layer 3. In this way, sufficient adhesion can be provided at the interface between the resin structure 1 and the heat generating device 7.

The constituent members of the resin structure 1 are described below.

Resin Layer 4

The resin layer 4 used in the resin structure 1 according to First Embodiment is formed on the water-based coating material layer 3 to improve the adhesion at the interface between the resin structure 1 and the heat generating device 7. The resin structure 1 is subject to external mechanical stimulations (for example, poking, grinding, and tearing). This may break or damage the thin film when the resin is a soft material such as rubber, and it is desirable to use a strong cured material. It is accordingly desirable that the resin layer 4 is a rigid thermosetting resin, for example, one or more selected from an acrylic resin, an epoxy resin, a urethane resin, and a silicon resin. A cured system of liquid epoxy resin and imidazole as a thin, film-like cured material is particularly preferred for its high rigidity.

Water-Based Coating Material Layer

The water-based coating material layer 3 is provided on the heat generating device 7. The heat generating device 7 corresponds to the "substrate" in the claims. The water-based coating material layer 3 includes the water-based coating material 5, and the spherical fillers 6.

Water-Based Coating Material 5

The water-based coating material 5 usable in First Embodiment is mixed with the fillers 6, and forms a coating as a cured material. It is accordingly desirable to use a resin having adhesion for metals. Desirably, the water-based coating material is, for example, one or more selected from an epoxy resin, a polysiloxane-based resin, and a urethane-based resin.

Amounts of Water-Based Coating Material 5 and Fillers 6

The amount of water-based coating material 5 is preferably 15 volume % to 40 volume % with respect to the total volume of the water-based coating material layer 3. In this case, the fillers 6 are 60 volume % to 85 volume %. These ranges are preferred for the following reasons.

For the total volume, 100 volume %, of the water-based coating material 5 and the fillers 6, the fillers 6 exceed 85 volume % when the water-based coating material 5 is below 15 volume %. Such a large proportion of the fillers 6 relative to the water-based coating material 5 makes it difficult to retain the fillers 6 in the water-based coating material layer 3. Specifically, ease of handling suffers. On the other hand, the fillers 6 will be less than 60 volume % when the water-based coating material 5 is more than 40 volume %. In this case, the surface area of fillers 6 projecting out of the water-based coating material layer 3 and the resin layer 4 becomes smaller, and the thermal radiation becomes inefficient. It is accordingly preferable that the fillers 6 are 60 volume % to 85 volume % of the total volume of the water-based coating material layer 3.

The quantitative relationship between the water-based coating material 5 and the fillers 6 will be described later in greater detail in the Examples below.

Fillers 6

Preferably, the fillers 6 are, for example, particles having a far-infrared emissivity of 0.8 or more, and an average particle size of 30 μm to 150 μm. The fillers 6 have an average aspect ratio of 1 to 12 as measured as a ratio of lengths along the long axis and the short axis through the center of gravity of the fillers 6. The shape may be, for example, spherical, conical or pyramidal, or polyhedral. Here, the fillers 6 are described as, for example, spherical particles.

The fillers 6 are not limited to a particular composition, provided that the far-infrared emissivity is 0.8 or more. Resins have a far-infrared emissivity of, for example, 0.6 to 0.8. The preferred far-infrared emissivity of the fillers 6 is 0.8 or more because the resin structure 1 is greatly influenced by the far-infrared emissivity of the resin layer 4 at the surface where the resin layer 4 and the fillers 6 are present. When the far-infrared emissivity of the fillers 6 is below 0.8, the far-infrared emissivity of the resin structure 1 falls below 0.8 because of the far-infrared emissivity of the resin layer 4, even with the fillers 6 projecting out of the resin layer 4. This results in inefficient thermal radiation.

The spherical fillers 6 may be oxide fillers, for example, such as magnesium oxide, zinc oxide, and titanium oxide.

The fillers 6 will be described later in greater detail in the Examples below.

Particle Size of Fillers 6

The fillers 6 are not necessarily required to have a uniform particle size, as long as the average particle size falls in the foregoing range.

When the average particle size of the fillers 6 is larger than 150 μm, large gaps are created between the projecting fillers 6, and the fillers 6 cannot be packed in high density. The coating adhesion also becomes insufficient. When the average particle size of the fillers 6 is smaller than 30 μm, the small dimensions make it difficult to control the thickness configured from the water-based coating material 5 of the water-based coating material layer 3. This results in poor workability when forming the water-based coating material layer 3.

Aspect Ratio of Fillers 6

The aspect ratio of fillers 6 is the ratio of the long axis and the short axis (long axis/short axis) through the center of gravity of the fillers 6. The aspect ratio of fillers 6 may be determined as the quotient of the longest side (maximum side: long side) and the shortest side (minimum side: short side) of a filler approximated to a cuboid. The fillers 6 are substantially spherical when the aspect ratio is less than about 1.2. When the aspect ratio is larger than 12, the surface area of the projecting portion corresponding to the short axis length becomes smaller for a given length of the long axis. This makes the thermal radiation less effective, and the heat dissipation suffers.

The fillers 6 may be, for example, spherical, conical or pyramidal, or polyhedral in shape. In the case of a conical or pyramidal shape, the fillers 6 are preferably a circular cone, a triangular pyramid, a quadrangular pyramid, or a polygonal pyramid. In the case of a polyhedron, the fillers 6 are preferably a regular tetrahedron, a regular hexahedron, or a regular tetradecahedron.

Projection of Fillers 6

The fillers 6 are at least partially present in the water-based coating material layer 3. The fillers 6 may be partially in contact with the heat generating device 7. The heat from the heat generating device 7 can efficiently transfer when the fillers 6 are in contact with the heat generating device 7. At least 80% of all fillers 6 have a length that is at least 1.7 times longer than the total thickness of the water-based coating material 5 of the water-based coating material layer 3 and the thermosetting resin of the resin layer 4, as measured along the long axis through the center of gravity of the fillers 6. Here, the thickness of the water-based coating material of the water-based coating material layer 3, and the thickness of the thermosetting resin of the resin layer 4 mean thicknesses attributed to the water-based coating material 5 and the thermosetting resin, excluding the fillers 6.

Preferably, the fillers 6 project out over a length at least 70% of the combined thickness of the water-based coating material layer 3 and the resin layer 4. When the projecting portion of the fillers 6 is less than 70% of the total thickness of the water-based coating material layer 3 and the resin layer 4, the surface area of the fillers 6 projecting out of the water-based coating material layer 3 and the resin layer 4 becomes smaller, and the thermal radiation becomes inefficient.

Alignment of Fillers 6

The fillers 6 are spherical in this embodiment, and the orientation of the fillers 6 is not of concern. It is accordingly preferable to align the fillers 6 so that the distance between the adjacent fillers is smaller than the particle size of the fillers 6. The spherical fillers are easier to handle than conical or pyramidal, or polyhedral fillers.

Preferably, at least 80% of the total number of fillers 6 project out of the water-based coating material layer 3 and the resin layer 4. When the percentage of fillers 6 projecting out of the water-based coating material layer 3 and the resin layer 4 is smaller than 80%, the far-infrared emissivity of the resin structure 1 falls below 0.8, and the thermal radiation becomes insufficient.

Method of Production of Resin Structure

The resin structure may be obtained as follows.

1) Fillers 6 having an average particle size of 30 μm to 150 μm are mixed with the water-based coating material 5 in an amount of 60 volume % to 85 volume %, and the mixture is applied to the heat generating device 7 to form the water-based coating material layer 3.

2) A thermosetting resin solution is applied to the water-based coating material layer 3 to form the resin layer 4. Here, the thermosetting resin solution may be applied from sides so as not to cover the projecting fillers 6, instead of being directly applied over the surface of the water-based coating material layer 3.

This forms the resin structure 1 on the heat generating device 7.

Electronic Component

As illustrated in FIG. 1A, the electronic component 2 according to First Embodiment has the resin structure 1 on the heat generating device 7. The resin structure 1 has high heat dissipation, and can sufficiently provide adhesion at the interface between the resin structure 1 and the heat generating device 7, as described above. Accordingly, the electronic component has high heat dissipation, and desirable adhesion at the interface between the resin structure 1 and the heat generating device 7.

Electronic Device

Figure 7:
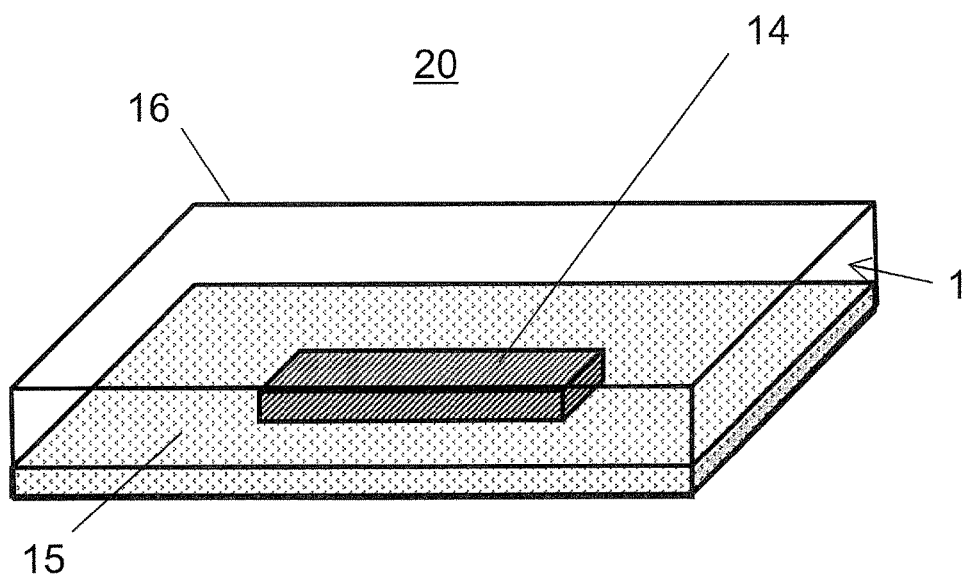
FIG. 7 is a schematic perspective view representing a configuration of an electronic device according to First Embodiment.
Figure 8:
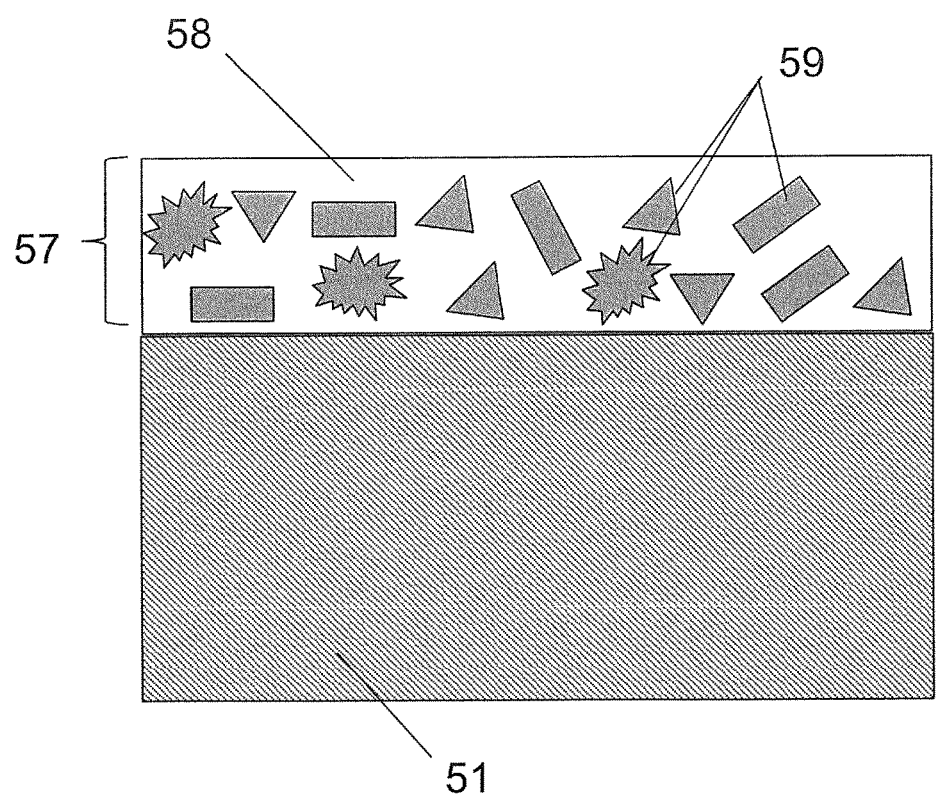
FIG. 8 is a cross sectional view representing a configuration in a cross section of a heat-dissipating member of an electronic component of related art.

FIG. 7 is a perspective view schematically representing a configuration of an electronic device 20 according to First Embodiment. As illustrated in FIG. 7, the electronic device 20 includes a substrate 15, a heat generator 14 provided on the substrate 15, a resin structure 1 provided on the substrate 15 and the heat generator 14, and a tablet casing 16 covering these components. The resin structure 1 is also applicable to dissipate heat of the heat generator 14 in the tablet casing 16 in applications such as in smartphones and tablets that are too small, light, and thin to accommodate fans or heatsinks, as in this example.

Second Embodiment

Resin Structure

Figure 1B:
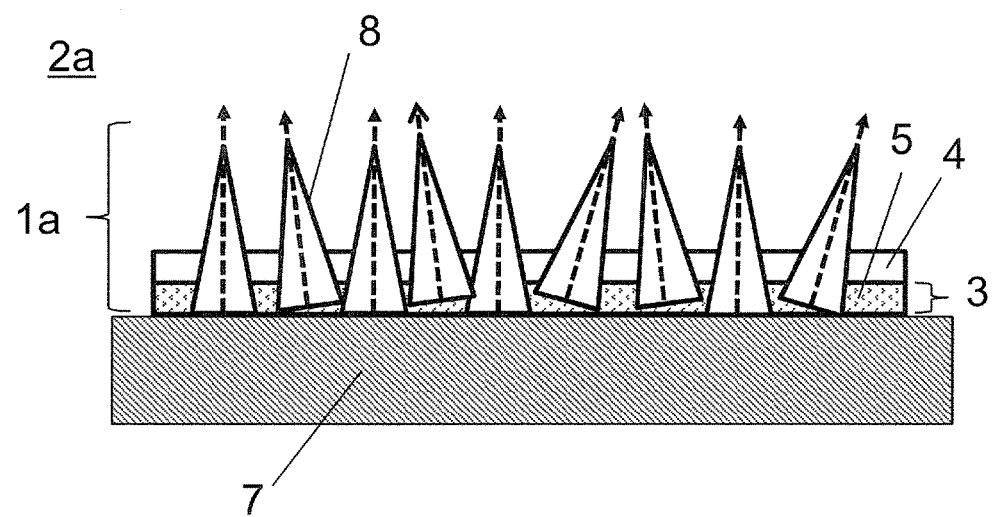
FIG. 1B is a cross sectional view representing a configuration in a cross section of a resin structure and an electronic component according to Second Embodiment.

FIG. 1B is a cross sectional view representing a configuration of a resin structure 1a and an electronic component 2a according to Second Embodiment. The resin structure 1a according to Second Embodiment differs from the resin structure of First Embodiment in that fillers 8 are conical or pyramidal, not spherical, in shape. The resin structure 1a includes a water-based coating material layer 3 provided on a heat generating device 7, and a resin layer 4 provided on the water-based coating material layer 3. The water-based coating material layer 3 includes a water-based coating material 5, and conical or pyramidal, or polyhedral fillers 8. The conical or pyramidal, or polyhedral fillers 8 are at least partially present in the water-based coating material layer 3, and at least 80% of all fillers 8 have a length that is at least 1.7 times longer than the total thickness of the water-based coating material 5 of the water-based coating material layer 3 and the thermosetting resin of the resin layer 4, as measured along the long axis through the center of gravity of the fillers 8. The fillers 8 have a far-infrared emissivity of 0.8 or more, and an average aspect ratio of 1 to 12 as measured as a ratio of lengths along the long axis and the short axis through the center of gravity of the fillers 8. In other words, in the resin structure 1a, the fillers 8 project out of the water-based coating material layer 3 and the resin layer 4.

Because the fillers 8 are projecting out of the water-based coating material layer 3 and the resin layer 4, the resin structure 1a can have high heat dissipation. The fillers 8 projecting out of the water-based coating material layer 3 and the resin layer 4 can be supported by the resin layer 4 provided on the water-based coating material layer 3. In this way, sufficient adhesion can be provided at the interface between the resin structure 1a and the heat generating device 7.

The constituent members of the resin structure 1a are described below. Essentially the same configurations already described in First Embodiment will not be described again.

Resin Layer 4

The resin layer 4 used in Second Embodiment has essentially the same configuration and properties as the resin layer used in First Embodiment, and will not be described again.

Water-Based Coating Material Layer

The water-based coating material layer 3 is provided on the heat generating device 7. The heat generating device 7 corresponds to the "substrate" in the claims. The water-based coating material layer 3 includes the water-based coating material 5, and the conical or pyramidal, or polyhedral fillers 8.

Water-Based Coating Material 5

The water-based coating material 5 usable in Second Embodiment has essentially the same configuration and properties as the water-based coating material used in First Embodiment, and will not be described again.

Amounts of Water-Based Coating Material 5 and Fillers 8

The amount of water-based coating material 5 is preferably 15 volume % to 40 volume % with respect to the total volume of the water-based coating material layer 3. In this case, the fillers 8 are 60 volume % to 85 volume %. These ranges are preferred for the following reasons.

For the total volume, 100 volume %, of the water-based coating material 5 and the fillers 8, the fillers 8 are more than 85 volume % when the water-based coating material 5 is below 15 volume %. Such a large proportion of the fillers 8 relative to the water-based coating material 5 makes it difficult to retain the fillers 8 in the water-based coating material layer 3. Specifically, ease of handling suffers. On the other hand, the fillers 8 are less than 60 volume % when the water-based coating material 5 is more than 40 volume %. In this case, the surface area of fillers 8 projecting out of the water-based coating material layer 3 and the resin layer 4 becomes smaller, and the thermal radiation becomes inefficient. It is accordingly preferable that the fillers 8 are 60 volume % to 85 volume % of the total volume of the water-based coating material layer 3.

The quantitative relationship between the water-based coating material 5 and the fillers 8 will be described later in greater detail in the Examples below.

Fillers 8

Preferably, the fillers 8 are, for example, particles having a far-infrared emissivity of 0.8 or more, and an average particle size of 30 μm to 150 μm. The fillers 8 have an average aspect ratio of 1 to 12 as measured as a ratio of lengths along the long axis and the short axis through the center of gravity of the fillers 8. The shape may be, for example, spherical, conical or pyramidal, or polyhedral. Here, the fillers 8 are described as, for example, conical or pyramidal, or polyhedral particles.

The fillers 8 are not limited to a particular composition, provided that the far-infrared emissivity is 0.8 or more. Resins have a far-infrared emissivity of, for example, 0.6 to 0.8. The preferred far-infrared emissivity of the fillers 8 is 0.8 or more because the resin structure 1a is greatly influenced by the far-infrared emissivity of the resin layer 4 at the surface where the resin layer 4 and the fillers 8 are present. When the far-infrared emissivity of the fillers 8 is below 0.8, the far-infrared emissivity of the resin structure 1a falls below 0.8 because of the far-infrared emissivity of the resin layer 4, even with the fillers 8 projecting out of the resin layer 4. This results in inefficient thermal radiation.

The conical or pyramidal, or polyhedral fillers 8 may be, for example, mineral fillers such as talc, kaolin, and cordierite, containing silica as a primary component.

Particle Size of Fillers 8

As used herein, the particle size of fillers 8 refers to the average size (average particle size) of a filler 8 approximated to a sphere (a sphere of the same volume).

When the average particle size of the fillers 8 is larger than 150 μm, large gaps are created between the projecting fillers 8, and the fillers 8 cannot be packed in high density. The coating adhesion also becomes insufficient. When the average particle size of the fillers 8 is smaller than 30 μm, the small dimensions make it difficult to control the thickness configured from the water-based coating material 5 of the water-based coating material layer 3. This results in poor workability when forming the water-based coating material layer 3.

Aspect Ratio of Fillers 8

The aspect ratio of fillers 8 is the ratio of the long axis and the short axis (long axis/short axis) through the center of gravity of the fillers 8. The aspect ratio of fillers 8 may be determined as the quotient of the longest side (maximum side: long side) and the shortest side (minimum side: short side) of a filler approximated to a cuboid. The fillers 8 are substantially spherical when the aspect ratio is less than about 1.2. When the aspect ratio is larger than 12, the surface area of the projecting portion corresponding to the short axis length becomes smaller for a given length of the long axis. This makes the thermal radiation less effective, and the heat dissipation suffers.

The fillers 6 of First Embodiment are spherical. In Second Embodiment, the fillers 8 are conical or pyramidal, or polyhedral in shape. In the case of a conical or pyramidal shape, the fillers 8 are preferably a circular cone, a triangular pyramid, a quadrangular pyramid, or a polygonal pyramid. In the case of a polyhedron, the fillers 8 are preferably a regular tetrahedron, a regular hexahedron, or a regular tetradecahedron.

Projection of Fillers 8

The fillers 8 are at least partially present in the water-based coating material layer 3. The fillers 8 may be partially in contact with the heat generating device 7. The heat from the heat generating device 7 can efficiently transfer when the fillers 8 are in contact with the heat generating device 7. At least 80% of all fillers 8 have a length that is at least 1.7 times longer than the total thickness of the water-based coating material 5 of the water-based coating material layer 3 and the thermosetting resin of the resin layer 4, as measured along the long axis through the center of gravity of the fillers 8. Here, the thickness of the water-based coating material of the water-based coating material layer 3, and the thickness of the thermosetting resin of the resin layer 4 mean thicknesses attributed to the water-based coating material 5 and the thermosetting resin, excluding the fillers 8.

Preferably, the fillers 8 project out over a length at least 70% of the combined thickness of the water-based coating material layer 3 and the resin layer 4. When the projecting portion of the fillers 8 is less than 70% of the total thickness of the water-based coating material layer 3 and the resin layer 4, the surface area of the fillers 8 projecting out of the water-based coating material layer 3 and the resin layer 4 becomes smaller, and the thermal radiation becomes inefficient.

Alignment of Fillers 8

When using the fillers 8, it is preferable that the long axis of the fillers be unidirectionally arranged (oriented) along a direction normal to the surface of the heat generating device 7 in at least 60% of all fillers 8. When the fillers 8 are conical or pyramidal, the long axis is the direction of fillers 8 tapering toward the apex from the base. Preferably, the fillers 8 are aligned so that the distance between the adjacent fillers 8 is not more than the average particle size of the fillers 8.

FIGS. 2A to 2C are schematic diagram illustrating the long axis direction of fillers 8. As used herein, "long axis direction of fillers" is the direction of the long axis through the center of gravity of the fillers. The long axis may represent a longer side of a filler 8 approximated to a cuboid. In FIGS. 2A to 2C, the long axis direction is the direction of the longer side of a filler 8 approximated to a cuboid. When the fillers 8 are conical or pyramidal, the long axis direction is, for example, the direction of fillers 8 tapering toward the apex from the base. Preferably, the long axis direction of the fillers 8 is arranged (oriented) in a direction perpendicular to the surface of the heat generating device 7.

As used herein, fillers being aligned (oriented) in perpendicular direction means that the long axis direction of fillers 8 is within ±20 degrees with respect to a direction normal to the surface of the heat generating device 7. Specifically, the fillers are regarded as being arranged (oriented) in perpendicular direction when the long axis direction is within a 200 tilt angle of a circular cone with respect to the direction of a normal line.

The fillers 8 will not be arranged close to one another, and the dissipation of heat by thermal radiation becomes insufficient when less than 60% of all fillers 8 are directed in the same direction, or when the distance between the adjacent fillers 8 is larger than the average particle size of the fillers, as shown in FIG. 3.

The number percentage of fillers arranged in the same direction is at least 60% for the reason described below with reference to Table 1.

The number percentage of fillers 8 projecting out of the water-based coating material layer 3 and the resin layer 4 is preferably 80% or more of the total number of fillers. When the number percentage is below 80%, the far-infrared emissivity of the resin structure 1a falls below 0.8, and the thermal radiation becomes insufficient.

Preferably, the fillers 8 project out over a length at least 70% of the total thickness of the water-based coating material 5 of the water-based coating material layer 3, and the resin layer 4. When the projecting portion of the fillers 8 is less than 70%, the surface area of the fillers 8 projecting out of the water-based coating material layer 3 and the resin layer 4 becomes smaller, and the thermal radiation becomes inefficient.

Other Fillers

In addition to the fillers 6 and the fillers 8, fillers having high heat conductivity may be incorporated in the water-based coating material layer 3 when producing the water-based coating material layer 3. In this way, the heat conductivity of the water-based coating material layer 3 can increase, and a heat dissipating resin can be obtained that has desirable heat conductivity and desirable thermal radiation.

The following Examples describe the resin structure of the present disclosure in greater detail. It is to be noted that the present disclosure is in no way limited by the following Examples.

EXAMPLES

Table 1 shows the conditions of the water-based coating materials and the fillers used to constitute the resin structures of Examples and Comparative Examples, along with the measured heat dissipation characteristics. The heat dissipation characteristics are shown with the measured results, including the results of determination, and the state of filler alignment. These are described below in detail.

TABLE 1

| Main components | Constituent | Content | Example 1 | Example 2 | Example 3 | Example 4 | Comparative Example 1 | Comparative Example 2 | Comparative Example 3 | Comparative Example 4 | Comparative Example 5 |
|---|---|---|---|---|---|---|---|---|---|---|---|
| Water-based coating material | Water-based epoxy base resin | EPICLON EXA-8150 | 2.7 | 2.7 | 2.7 | 2.7 | | No application of composition | 2.7 | 2.7 | 2.7 |
| | Epoxy curing agent | WATERSOL S-695 | 0.15 | 0.15 | 0.15 | 0.15 | | | 0.15 | 0.15 | 0.15 |
| | Epoxy catalyst | BECKAMINE P-198 | 0.010 | 0.010 | 0.010 | 0.010 | | | 0.010 | 0.010 | 0.010 |
| | Water-based polyurethane | Bayhydrol UH2342 | | | | | 50.0 | | | | |
| Filler | Magnesium oxide | Spherical particle size 30 μm aspect ratio 1.1 | 57.4 | 23.8 | | 30.0 | | | | | 15.27 |
| | Magnesium oxide | Spherical particle size 20 μm aspect ratio 1.1 | | | | | | | | | |
| | Cordierite | Polyhedron particle size 1.7 μm aspect ratio 5 | | | | | 7.5 | | | | |
| | Cordierite | Polyhedron particle size 40 μm aspect ratio 5 | | | 11.0 | 9.0 | | | | | |
| | Cordierite | Polyhedron particle size 150 μm aspect ratio 5 | | | | | | | 11.0 | | |
| | Graphite | Plate-shape particle size 150 μm aspect ratio 12 | | | | | | | | 9.9 | |
| Total (parts by weight) | | | 60.2 | 26.6 | 13.9 | 41.8 | 57.5 | | 13.9 | 12.8 | 18.1 |
| Filler content (mass %) | | | 95.3 | 89.4 | 79.6 | 93.2 | 13.0 | | 79.6 | 77.8 | 84.4 |
| Filler content (volume %) | | | 85.0 | 70.0 | 60.0 | 80.6 | 5.5 | | 60.0 | 70.0 | 60.0 |
| Filler alignment | | Proportion of fillers aligned in the same direction (%) | 100.0 | 100.0 | 60.0 | 88.5 | 20.0 | — | 55.0 | 60.0 | 100.0 |
| | | Proportion of projecting fillers (number percent) | 90.0 | 80.0 | 80.0 | 84.0 | 0.0 | — | 79.0 | 95.0 | 50.0 |
| | | Proportion of projecting fillers (percentage of surface area) | 35.0 | 25.0 | 40.0 | 38.0 | 0.0 | — | 75.0 | 80.0 | 15.0 |
| | | Thickness of projecting fillers (factor with respect to water-based coating material layer 3 and resin layer 4) | 1.7 | 1.7 | 2.2 | 2.2 | | | | | |
| Heat dissipation characteristics | Thermal radiation | Far-infrared emissivity (−) | 0.90 | 0.80 | 0.95 | 0.92 | | | | | |
| | | Determination (−) | Good | Good | Good | Good | | | | | |
| | Inhibition of temperature increase | Measured value (° C.) | 72 | 74 | 76 | 71 | | | | | |
| | | Temperature difference ΔT (° C.) | 13 | 11 | 9 | 14 | | | | | |
| | | Percentage inhibition of temperature increase (%): Heat dissipation | 15.3 | 12.9 | 10.6 | 16.5 | | | | | |
| | | Determination (−) | Excellent | Good | Good | Excellent | | | | | |
| | Overall determination | Determination (−) | Excellent | Good | Good | Excellent | | | | | |

TABLE 1-continued

| | | | | | | | |
|---|---|---|---|---|---|---|---|
| | | Thickness of projecting fillers (factor with respect to water-based coating material layer 3 and resin layer 4) | 0.0 | | 8.3 | 8.3 | 1.5 |
| Heat dissipation characteristics | Thermal radiation | Far-infrared emissivity (-) | 0.73 | | 0.79 | 0.85 | 0.75 |
| | | Determination (-) | Poor | | Poor | Good | Poor |
| | Inhibition of temperature increase | Measured value (° C.) | 83 | 85 | 80 | 81 | 79 |
| | | Temperature difference ΔT (° C.) | 2 | — | 5 | 4 | 6 |
| | | Percentage inhibition of temperature increase (%): Heat dissipation | 2.4 | — | 5.9 | 4.7 | 7.1 |
| | | Determination (-) | Poor | — | Poor | Poor | Poor |
| | Overall determination | Determination (-) | Poor | — | Poor | Poor | Poor |

Figure 4:
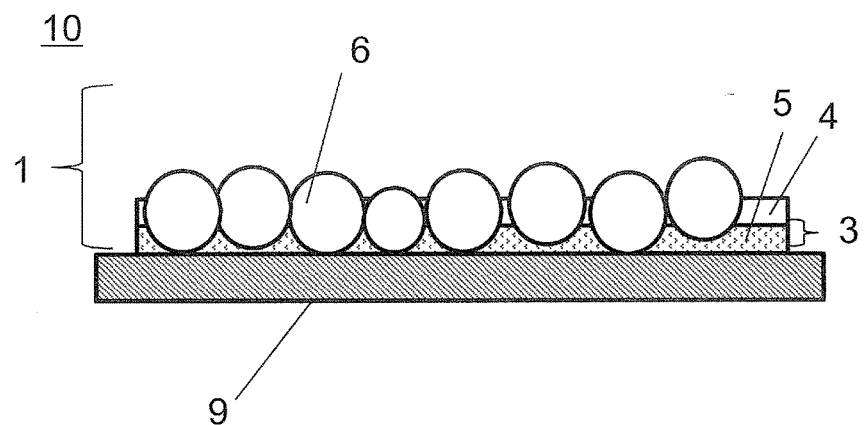
FIG. 4 is a schematic diagram of a heat dissipation evaluation device used to produce the resin structure according to First Embodiment.

A heat dissipation evaluation device 10 shown in FIG. 4 is fabricated to evaluate the heat dissipation of a resin structure 1. The heat dissipation evaluation device 10 includes a resin structure 1, and a metal substrate 9.

Resin Structure 1

The production of the resin structure 1 is described below, taking Example 1 as an example.

Production of Water-Based Coating Material Layer

1) Spherical magnesium oxide particles having a particle size of 30 μm are used as fillers 6. The epoxy base resin EPICLON EXA-8150 (DIC), the epoxy curing agent WATERSOL S-695 (DIC), and the epoxy catalyst BECK-AMINE P-198 (DIC) are used as the water-based coating material 5. These materials are mixed in the predetermined amounts shown in Table 1 to produce a mixture containing 85 volume % filler.

2) The mixture is applied to the metal substrate 9 in a thickness of 10 μm using a metal mask, and cured at 160° C. for 20 min to produce a water-based coating material layer 3.

The water-based coating material layer 3 coated has a thickness of 8 μm after evaporation of the solvent water.

Production of Resin Layer

3) A thermosetting resin is used as the resin layer 4. The thermosetting resin is, for example, a 15.6:84.2:0.2 (mass %) mixture of epoxy base resin HBE-100 (New Japan Chemical Co., Ltd.), epoxy curing agent TBN-40 (New Japan Chemical Co., Ltd.), and curing promoting agent U-CAT 5003 (San-Apro Ltd.) prepared as a thermosetting resin solution.

4) The thermosetting resin solution is applied onto the water-based coating material layer 3 in a thickness of 10 μm using a dispenser. The thermosetting resin solution may be applied from the sides so as not to cover the projecting fillers 6, instead of being directly applied over the surface of the water-based coating material layer 3. In this way, the thermosetting resin can be prevented from covering the surface of the fillers 6. The solution is dried at 100° C. for 10 min to remove the solvent, and cured at 150° C. for 1 to 2 hours.

The water-based coating material layer 3, and the resin layer 4 are mounted on the metal substrate 9 after the foregoing procedure, and the heat dissipation evaluation device 10 is produced. The bottom surface of the fillers 6 or 8 is partially in contact with the surface of the metal substrate 9.

Heat Dissipation Evaluation Jig

Figure 5:
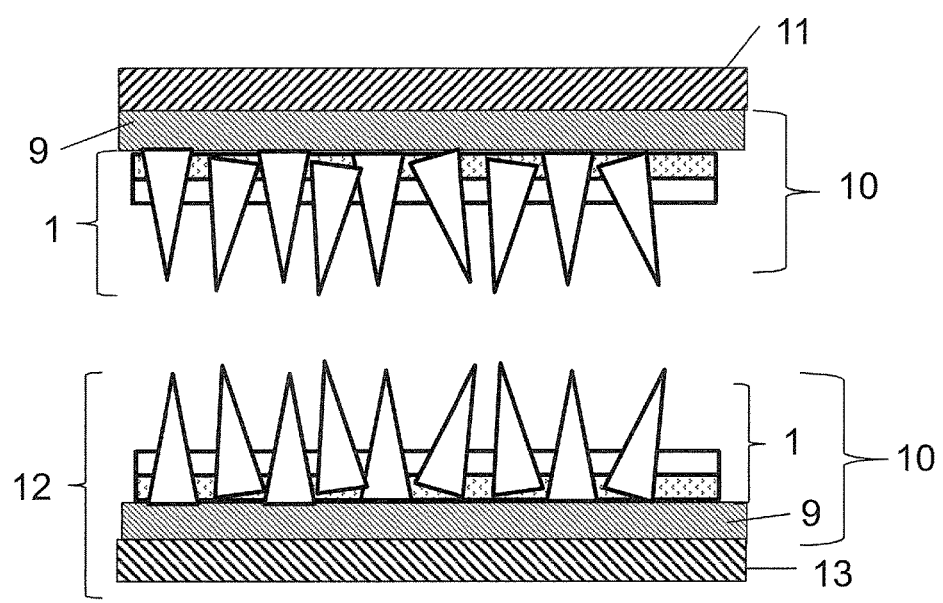
FIG. 5 is a cross sectional view representing a configuration in a cross section of a heat dissipation evaluation jig of Examples 1 to 4, and Comparative Examples 1, and 3 to 5.

For the evaluation of heat dissipation, the heat dissipation evaluation jig shown in FIG. 5 was produced using the heat dissipation evaluation device 10. FIG. 5 is a cross sectional view showing a configuration of the heat dissipation evaluation jig. The heat dissipation evaluation jig includes the heat dissipation evaluation device 10, a heater 11, and a heat radiation absorber 12. The heat dissipation evaluation device 10 was produced by applying the resin structure 1 to the metal substrate 9 in the manner described above.

A 1 mm-thick aluminum substrate measuring 60 mm×60 mm in size was prepared as the metal substrate 9. The heater 11 (60 mm×60 mm in size, 10 mm thick) with a built-in thermocouple was mounted on the back surface of the heat dissipation evaluation device 10 by being attached with a heat dissipating silicone grease.

The heat radiation absorber 12 includes the heat dissipation evaluation device 10, and a water-cooled heatsink 13. The heat radiation absorber 12 was produced by attaching the water-cooled heatsink 13 (60 mm×60 mm in size, 10 mm thick) to the back surface of the heat dissipation evaluation device 10 by being attached with a heat dissipating silicone grease. A chiller was attached to the water-cooled heatsink 13, and the temperature of the heat radiation absorber 12 was maintained constant at 25° C. by circulating 25° C. water.

Examples 1 to 4

The heat dissipation evaluation device 10, and the heat dissipation evaluation jig were produced by following the procedures described in the Resin Structure 1 section above, using the conditions shown in Table 1.

Comparative Example 1

Comparative Example 1 differs from Example 1 in that the water-based coating material layer 3 was solely fabricated on the metal substrate 9 without the resin layer 4.

Polyhedral cordierite particles having a particle size of 1.7 μm, and an aspect ratio of 5 were used as fillers 6. Bayhydrol UH2342 (Bayer), a water-based polyurethane product, was used as the water-based coating material 5. These materials are mixed in the predetermined amounts shown in Table 1 to produce a mixture containing 13 volume % filler. The mixture is applied to the metal substrate 9 in a thickness of 10 μm using a metal mask, and cured at 70° C. for 30 min to produce a water-based coating material layer 3. The water-based coating material layer 3 coated has a thickness of 8 μm after evaporation of the solvent water.

Comparative Example 2

Figure 6:
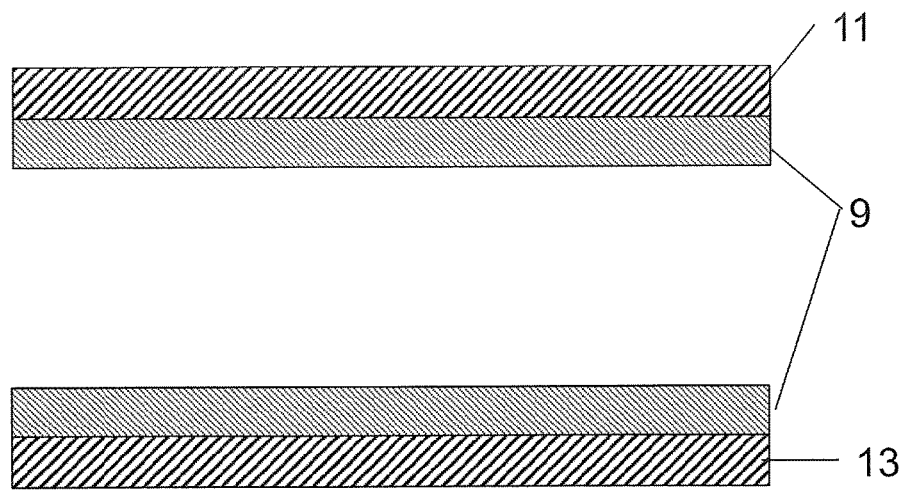
FIG. 6 is a cross sectional view representing a configuration in a cross section of a heat dissipation evaluation jig of Comparative Example 2.

Comparative Example 2 differs from Example 1 in that the metal substrate 9 is used alone, without fabricating the resin structure 1. When the metal substrate 9 is used alone as in Comparative Example 2, the heat dissipation evaluation jig takes the form shown in FIG. 6, as opposed to the structure shown in FIG. 5. FIG. 6 shows a cross sectional view of the heat dissipation evaluation jig of Comparative Example 2. The heat dissipation evaluation jig includes the metal substrate 9, the heater 11, and the water-cooled heatsink 13. These are the same as those used in FIG. 5.

Comparative Examples 3 to 6

The resin structures 1 according to Comparative Examples 3 to 6 were produced by using the same procedures described in Example 1, and the heat dissipation evaluation jig shown in FIG. 5 was produced.

The heat dissipation evaluation devices produced under the conditions shown in Table 1 were measured for far-infrared emissivity, and temperature change for inhibition of temperature increase. These were evaluated as follows.

Measurement of Far-Infrared Emissivity

Far-infrared emissivity is measured for each sample of the heat dissipation evaluation devices 10 of Examples and Comparative Examples excluding Comparative Example 2, using a quick emissivity measurement device (Model: TSS-5X, Japan Sensor Corporation). Here, the far-infrared emissivity is a mean value of spectral far-infrared emissivities in a 2 to 22 μm wavelength range.

Samples were determined as Good when the far-infrared emissivity was 0.8 or more, and Poor when the far-infrared emissivity did not satisfy this condition, as shown Table 1. Samples were determined as overall acceptable when the percentage inhibition of temperature increase was 10% or more.

Measurement of Temperature Change for Inhibition of Temperature Increase

The heat dissipation evaluation jig of FIG. 5 including the heat dissipation evaluation device 10 of Examples and Comparative Examples is installed in a 25° C. thermostat bath, and current is passed through the heater 11 under windless conditions.

The temperature difference ΔT of the heater 11 (excluding Comparative Example 2) from the temperature, 85° C., of the heater 11 of Comparative Example 2 was determined under increasing voltages according to the following formula 1.

$$\Delta T = [85° C. - \text{temperature of heater 11}] \quad \text{Formula 1}$$

With the resin structure 1 of Example 1 applied to the metal substrate 9, the temperature difference (ΔT) as a measure of inhibition of temperature increase was 13° C., relative to 85° C.

The percentage inhibition of temperature increase is defined by the following formula 2.

$$\text{Percentage inhibition of temperature increase} = (\Delta T) \div 85° C. \quad \text{Formula 2}$$

Samples were determined as Excellent, Good, or Poor under the following criteria. The percentage inhibition of temperature increase is about 10% for many of heat-dissipating coating materials using water-based coating materials. Accordingly, samples were determined as Poor when the percentage inhibition of temperature increase was less than 10%, Good when the percentage inhibition of temperature increase was 10% or more and less than 15%, and Excellent when the percentage inhibition of temperature increase was 15% or more.

It is desirable to have larger values of percentage inhibition of temperature increase. However, samples were determined as acceptable when the percentage inhibition of temperature increase was 10% or higher. A percentage inhibition of temperature increase of less than 10% is not effective when costs such as that for applying paste are considered, though it may be sufficient in certain applications.

Overall Determination of Heat Dissipation

The heat dissipation of samples was evaluated according to the following criteria in the present disclosure. Specifically, samples were determined overall as Excellent when the result of the far-infrared emissivity measurement, and the result of the measurement of temperature change for inhibition of temperature increase were both Good. Samples were determined overall as Poor when the result of either of these measurement results was Poor. The overall determination was Good for other samples.

Alignment of Fillers

Table 1 shows the proportion (%) of unidirectionally aligned fillers 6 or 8 in the resin structures 1 of Examples and Comparative Examples. Here, the proportion (%) of unidirectionally aligned (oriented) fillers is the number proportion of fillers that are aligned (oriented) in a direction perpendicular to the metal substrate 9 with respect to all fillers present in an observed cross section of the heat dissipation evaluation device 10. The fillers 6 are spherical, and the number proportion is 100%.

By "being aligned (oriented) in perpendicular direction," it means that the long axis direction of the filler is within ±20 degrees of a direction normal to the surface of the metal substrate 9. Table 1 shows the proportion (%) of fillers projecting out of the resin layer 4 in the resin structures 1 of Examples and Comparative Examples. Here, the proportion (%) means the number proportion of fillers 6 or 8 projecting out of the resin layer 4 with respect to all fillers present in an observed cross section of the heat dissipation evaluation device 10. It also means the proportion of the surface area of fillers projecting out of the surface of the resin layer 4 with respect to the surface area of all fillers.

The far-infrared emissivity of the resin structure 1 increases as the surface area of the resin structure 1, specifically the surface irregularities of the resin structure 1 due to the aligned fillers increase.

Table 1: Discussions

As is clear from the results shown in Table 1, the resin structures 1 of Examples have higher values of far-infrared emissivity, and more desirable heat dissipation than the resin structures of Comparative Examples.

Filler Content

From Examples 1 to 4, the preferred filler content is 60 volume % to 85 volume %.

Aspect Ratio of Fillers 8

By comparing Examples 3 to 4 with Comparative Example 4, the graphite used in Comparative Example 4 is plate-like in shape, and has an aspect ratio greater than 12. Because of the large aspect ratio, the projecting surface area corresponding to the short axis length becomes smaller for a given length of the long axis. This makes the thermal radiation less effective, and the heat dissipation suffers.

It can be seen from these results that the preferred average aspect ratio of fillers 8 is 1 to 12.

Alignment of Filler

Proportion of Projecting Fillers (Number Proportion in Percent)

By comparing Examples 1 to 4 with Comparative Example 1, 80% or a larger percentage of fillers project out of the surface of the resin layer 4 in Examples 1 to 4, whereas no filler projects out of the water-based coating material layer in Comparative Example 1. Comparative Example 1 was accordingly insufficient in terms of both thermal radiation, and inhibition of temperature increase.

By comparing Examples 1 to 4 with Comparative Example 3, 80% or a larger percentage of fillers project out of the surface of the resin layer 4 in Examples 1 to 4, whereas the number of fillers projecting out of the resin layer is less than 80% in Comparative Example 3. Accordingly, the far-infrared emissivity of the resin structure 1 was less than 0.8, and the thermal radiation was insufficient.

Proportion (%) of Fillers Aligned in the Same Direction

By comparing Examples 1 to 4 with Comparative Example 3, the fillers were oriented in the same direction, specifically in a direction perpendicular to the surface of the metal substrate in 60% or a larger percentage of all fillers in Examples 1 to 4. In contrast, the number of fillers directed in the same direction, specifically in a direction perpendicular to the surface of the metal substrate was less than 60% in Comparative Example 3. Accordingly, the far-infrared emissivity of the resin structure 1 was less than 0.8, and the thermal radiation was inefficient in Comparative Example 3.

It is accordingly preferable that at least 60% of fillers 8 are oriented in the same direction, specifically in a direction perpendicular to the surface of the metal substrate.

Thickness of Projecting Fillers (Factor with Respect to Total Thickness of Water-Based Coating Material Layer 3 and Resin Layer 4)

By comparing Examples 1 to 4 with Comparative Example 5, the fillers of Examples 1 to 4 have a thickness (a length along the long axis) that is larger than the total thickness of the water-based coating material layer 3 and the resin layer 4 by a factor of 1.7 or more. Accordingly, 80% or a larger percentage of all fillers are projecting out of the water-based coating material layer and the resin layer. In contrast, the number of fillers projecting out of the water-based coating material layer 3 and the resin layer 4 is 50% or less in Comparative Example 5. Accordingly, the far-infrared emissivity of the resin structure 1 was less than 0.8, and the thermal radiation was inefficient.

It is accordingly preferable that the length of the fillers 6 or 8 along the long axis are longer than the total thickness of the water-based coating material layer 3 and the resin layer 4 by a factor of 1.7 or more, and that 50% or a larger percentage of fillers project out of the water-based coating material layer 3 and the resin layer 4.

Overall Summary

As described above, in the resin structure according to the present disclosure, at least 80% of the total number of fillers have a length that is at least 1.7 times longer than the total thickness of the water-based coating material of the water-based coating material layer and the thermosetting resin of the resin layer, as measured along the long axis through the center of gravity of fillers. In this way, 80% or a larger percentage of fillers project out of the water-based coating material layer and the resin layer, and high heat dissipation can be obtained. The resin layer provided on the water-based coating material layer can support the projecting fillers, and provide sufficient adhesion at the interface between the resin structure and the heat generating device.

The resin structure according to the present disclosure uses fillers having a far-infrared emissivity of 0.8 or more, a particle size of 30 μm to 150 μm, and an aspect ratio of 1 to 12. This makes it possible to improve the thermal radiation efficiency of the resin structure, and to inhibit temperature increase by dissipating the heat of the heat generating device by thermal radiation.

The present disclosure is intended to encompass any appropriate combinations of the Embodiments and/or Examples described above, and it is to be understood that such combinations can exhibit the effects of the Embodiments and/or Examples above.

INDUSTRIAL APPLICABILITY

The resin structure according to the present disclosure has high heat dissipation, and desirable adhesion at the interface with a heat generating device, and is useful as a resin structure for dissipating heat of electronic components.

What is claimed is:

1. A resin structure provided on a substrate and for dissipating heat of the substrate to outside, comprising:
    a water-based coating material layer provided on the substrate and including a water-based coating material, and fillers having an average particle size of 30 μm to 150 μm; and
    a resin layer provided on the water-based coating material layer and containing a thermosetting resin,
    the fillers having a far-infrared emissivity of 0.8 or more, and an average aspect ratio of 1 to 12 as measured as a ratio of lengths along the long axis and the short axis through the center of gravity of the fillers,
    at least 80% of the total number of fillers having a length that is at least 1.7 times longer than a total thickness of the water-based coating material of the water-based coating material layer and the thermosetting resin of the resin layer, as measured along the long axis through the center of gravity of the fillers.

2. The resin structure according to claim 1, wherein the fillers are spherical, conical or pyramidal, or polyhedral in shape.

3. The resin structure according to claim 1, wherein the direction along the long axis is oriented in a direction perpendicular to the substrate in at least 60% of the total number of fillers.

4. The resin structure according to claim 1, wherein the fillers are disposed so that adjacent two fillers are separated from each other by a distance that is not more than the average particle size of the fillers.

5. The resin structure according to claim 1, wherein the fillers are contained in an amount of 60 volume % to 85 volume % of a composition of the water-based coating material layer.

6. The resin structure according to claim 1, wherein the total thickness of the water-based coating material layer and the resin layer is 50 μm or less.

7. An electronic component comprising the resin structure of claim 1, wherein the substrate is an outer surface of the electronic component, and has the resin structure on an outer surface of the electronic component.

8. An electronic device comprising the electronic component of claim 7.

* * * * *